United States Patent
Yadav et al.

(10) Patent No.: US 11,967,645 B2
(45) Date of Patent: Apr. 23, 2024

(54) POWER MOSFETs STRUCTURE

(71) Applicant: TAIWAN SEMICONDUCTOR MANUFACTURING COMPANY LTD., Hsinchu (TW)

(72) Inventors: Yogendra Yadav, Hsinchu (TW); Chi-Chih Chen, Yunlin County (TW); Ruey-Hsin Liu, Hsinchu (TW); Chih-Wen Yao, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 453 days.

(21) Appl. No.: 17/390,565

(22) Filed: Jul. 30, 2021

(65) Prior Publication Data

US 2021/0359129 A1 Nov. 18, 2021

Related U.S. Application Data

(63) Continuation of application No. 16/878,229, filed on May 19, 2020, now Pat. No. 11,088,277, which is a (Continued)

(51) Int. Cl.
*H01L 29/78* (2006.01)
*H01L 29/08* (2006.01)
(Continued)

(52) U.S. Cl.
CPC ...... *H01L 29/7823* (2013.01); *H01L 29/0865* (2013.01); *H01L 29/0882* (2013.01); (Continued)

(58) Field of Classification Search
CPC ......... H01L 21/28008; H01L 21/28061; H01L 27/0733; H01L 29/0653; H01L 29/0847; H01L 29/0865; H01L 29/0882; H01L 29/1095; H01L 29/402; H01L 29/42356; H01L 29/42368; H01L 29/42376; H01L 29/512; H01L 29/66477; H01L 29/66659; H01L 29/66681; H01L 29/78; H01L 29/7823; H01L 29/7835
See application file for complete search history.

(56) References Cited

U.S. PATENT DOCUMENTS

2013/0134512 A1* 5/2013 Cheng .................. H01L 29/402
257/E29.256

* cited by examiner

*Primary Examiner* — Mohammad M Hoque
*Assistant Examiner* — Kevin Quinto
(74) *Attorney, Agent, or Firm* — WPAT LAW; Anthony King

(57) ABSTRACT

A semiconductor device is provided. The semiconductor device includes a substrate, a field plate, a gate electrode, and a first dielectric layer. The substrate has a top surface. The substrate includes a first drift region with a first conductivity type extending from the top surface of the substrate into the substrate, and includes a second drill region with the first conductivity type extending from the top surface of the substrate into the substrate and adjacent to the first drift region. The field plate is over the substrate. The gate electrode has a first portion and a second portion, wherein the first portion of the gate electrode is located over the field plate. The first dielectric layer is between the substrate and the field plate. The first portion of the gate electrode is overlapping with a boundary of the first drift region and the second drift region in the substrate.

20 Claims, 8 Drawing Sheets

Related U.S. Application Data continuation of application No. 16/389,664, filed on Apr. 19, 2019, now Pat. No. 10,672,904, which is a continuation of application No. 15/863,734, filed on Jan. 5, 2018, now Pat. No. 10,269,954, which is a continuation of application No. 14/977,302, filed on Dec. 21, 2015, now Pat. No. 9,871,134.

(51) Int. Cl.
*H01L 29/10* (2006.01)
*H01L 29/40* (2006.01)
*H01L 29/423* (2006.01)
*H01L 29/51* (2006.01)
*H01L 29/66* (2006.01)
*H01L 27/07* (2006.01)

(52) U.S. Cl.
CPC ........ *H01L 29/1095* (2013.01); *H01L 29/402* (2013.01); *H01L 29/42356* (2013.01); *H01L 29/42368* (2013.01); *H01L 29/42376* (2013.01); *H01L 29/512* (2013.01); *H01L 29/66659* (2013.01); *H01L 29/66681* (2013.01); *H01L 29/7835* (2013.01); *H01L 27/0733* (2013.01); *H01L 29/0847* (2013.01)

POWER MOSFETs STRUCTURE

CROSS REFERENCE TO RELATED APPLICATION

This application is a continuation of U.S. patent application Ser. No. 16/878,229, filed May 19, 2020, which is a continuation of U.S. patent application Ser. No. 16/389,664, filed Apr. 19, 2019, granted as U.S. Pat. No. 10,672,904, which is a continuation of U.S. patent application Ser. No. 15/863,734, filed Jan. 5, 2018, granted as U.S. Pat. No. 10,269,954, which is a continuation of U.S. patent application Ser. No. 14/977,302, filed Dec. 21, 2015, granted as U.S. Pat. No. 9,871,134, each of which is herein incorporated by reference in its entirety.

BACKGROUND

Since the invention of semiconductor devices based on the bipolar technology, such as the bipolar junction transistor (BJT), strong efforts have been made to increase the power handling capability of these devices in order to extend their applications. The metal-oxide-semiconductor field-effect transistor (MOSFET) is a transistor used for amplifying or switching electronic signals. The MOSFET is a four-terminal device with source (S), gate (G), drain (D), and body (B) terminals. The MOSFET is by far the most common transistor in both digital and analog circuits, though the BJT was at one time much more common.

As the CMOS technology gained importance and process technology in the field of integrated circuits was surpassing the development of bipolar technology used for power devices, the power MOSFET was introduced. It is now possible to use the steady progress in CMOS technology for the development of improved power devices such as the power MOSFET. Power MOSFET may have superior performance compared to its bipolar counterpart. For example, the n-channel power MOSFET is operating with electron transport which is inherently faster than the combined electron and hole transport the BJTs rely on.

Power MOSFETs are known for a better switching speed compared to BJT power devices, and they require very little gate drive power because of the insulated gate. The main drawbacks of the power MOSFET are high on-resistance and the overlay control problem. Methods and apparatus are needed to improve the power MOSFET performance on the high on-resistance and the overlay control problem.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAILED DESCRIPTION OF THE INVENTION

Figure 1:
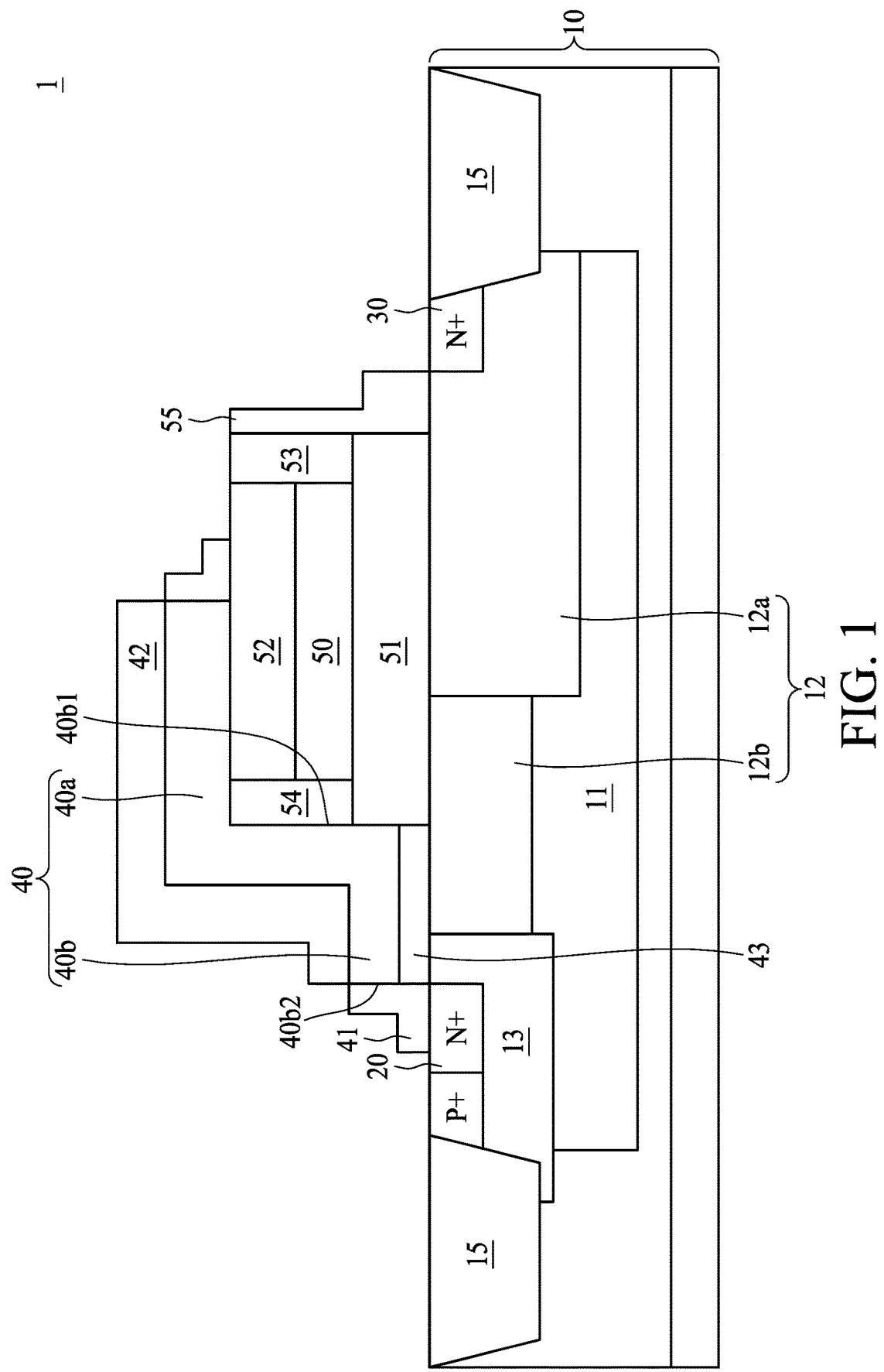
FIG. 1 is a schematic diagram of a power MOSTET, in accordance with some embodiments.

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 is a power metal-oxide-semiconductor field-effect transistor (MOSFET) 1 in accordance with one embodiment of the present disclosure. The power MOSFET includes a substrate 10, a source region 20, a drain region 30, a gate electrode 40 and a field plate 50.

The substrate 10 may be a p type doped substrate, or an n type doped substrate, which means that the semiconductor substrate 10 may be doped with either n type or p type impurities. The substrate 10 is formed from silicon, gallium arsenide, silicon germanium, silicon carbon, or other known semiconductor materials used in semiconductor device processing. Although a semiconductor substrate is used in the illustrated examples presented herein, in other alternative embodiments, epitaxially grown semiconductor materials or silicon on insulator (SOI) layers may be used as the substrate 10.

It is common knowledge that dopant impurities can be implanted into a semiconductor material to form a p type or an n type material. A p type material may be further classified as p++, p+, p, p−, p−−, type materials, depending on the concentration of the dopant. If a material is stated to be a p type material, it is doped with p type impurities its and it may be any of the p++, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials. Dopant atoms for p type materials include boron, for example. In n type materials, dopant atoms include phosphorous, arsenic, and antimony, for example. Doping may be done through ion implantation processes. When coupled with photolithographic processes, doping may be performed in selected areas by implanting atoms into exposed regions while other areas are unasked. Also, thermal drive or anneal cycles may be used to use thermal diffusion to expand or extend a previously doped region. As alternatives, some epitaxial deposition of semiconductor materials allows for in-situ doping during the epitaxial processes. It is common knowledge that implantation can be done through certain materials, such as thin oxide layers.

The doping concentration amounts for the well region and the diffusions described may vary with the process used and the particular design. Doping concentrations at a p type material or an n type material may range from $10^{14}$ atoms/cm$^3$ to $10^{22}$ atoms/cm$^3$, with a p+/n+ material with concentrations being greater than about $10^{18}$/cm$^3$, for example. Some other ranges of concentrations may be used, such as a n−−/p−− material with a doping concentration less than $10^{14}$ atoms/cm$^3$ a n−/p − material with a doping concentration ranging from $10^{14}$ atoms/cm$^3$ to $10^{16}$ atoms/cm$^3$, a n/p material with a doping concentration ranging from $10^{16}$ atoms/cm$^3$ to $10^{18}$ atoms/cm$^3$, a n+/p+ material with a doping concentration ranging from $10^{18}$ atoms/cm$^3$ to $10^{20}$ atoms/cm$^3$ and a n++/p++ material with a doping concentration ranging larger than $10^{20}$ atoms/cm$^3$. Further alternative ranges of concentrations may be used, such as a n−−/p−− material with a doping concentration range around $10^{15}$ to $10^{18}$/cm$^3$, and a n−/p− material with a doping concentration 5 to 100 times heavier than the concentration of a n−−/p−− material.

As shown in FIG. 1, the substrate 10 includes a first region 11, a second region 13, a drift region 12 and insulation regions 15.

Insulation regions 15 extend from a top surface of substrate 10 into the substrate 10. Insulation regions 15 may be Shallow Trench Isolation (STI) regions. In another embodiment, insulation regions 15 may also be other types of insulation regions such as field oxide regions.

The first region 11 of a second conductivity type is formed by implanting ions of an impurity of a second conductivity type, such as a p type, into the substrate 10 through an insulating film and then thermally diffusing the implanted ions. The first region 11 may have an impurity concentration between about $10^{15}$/cm$^3$ and about $10^{17}$/cm$^3$, although a higher or a lower concentration may be used. There may be an n+ buried layer (NBL) formed beneath the first region 11, which is not shown.

The second region 13 of the second conductivity type, such as the p type, is within the first region 11, and is separated from other devices by the insulation region 15. In some exemplary embodiments, the second region 13 has a p type impurity concentration higher than the impurity concentration of the first region 11. For example, the p type impurity concentration of the second region 13 may be between about $10^{16}$/cm$^3$ and about $10^{18}$/cm$^3$, although a higher or a lower impurity concentration may be adopted.

The drift region 12 of a first conductivity type, such as an n type, is within the first region 11. According to one embodiment, the drift region includes a first drift region 12a and a second drift region 12b. The first drift region 12a extends from the top surface of the substrate 10 into the substrate 10. The n type impurity concentration of the first drift region 12a may be between about $10^{15}$/cm$^3$ and about $10^{17}$/cm$^3$, although higher or lower impurity concentrations may be adopted.

The second drift region 12b is within the first region 11, adjacent to the first drift region 12a, with a depth less than a depth of the first drift region 12a so that the first drift region 12a and the second drift region 12b together form a stepwise shape. The second drift region 12b may have a similar impurity concentration of the first conductivity type as the impurity concentration of the first drift region 12a. However, in some other embodiments, the second drift region 12b may have a different impurity concentration of the second conductivity type from the impurity concentration of the first drift region 12a.

The source region 20 of the first conductivity type is within the second region 13. The drain region 30 of the first conductivity type is within the first drift region 12a. The source region 20 may have a source contact (not shown in the drawing). The drain region 30 may have a drain contact (not shown in the drawing). Both the source region 20 and the drain region 30 are formed by implanting ions of an impurity of a first conductivity type, such as an n type, into the second region 13 and the first drift region 12a, respectively. The source region 20 and the drain region 30 may be formed by implanting an n type dopant such as phosphorous to a concentration between about $1\times10^{19}$/cm$^3$ and about $2\times10^{21}$/cm$^3$, for example. Alternatively, other n type dopants such as arsenic, antimony, or combinations thereof, may also be used.

A dielectric layer 51 is on the top surface of the substrate 10 and covers a part of the first drift region 12a and a part of the second drift region 12b. The dielectric layer 51 may include silicon oxide, silicon nitride, silicon oxynitride, a high-k dielectric material, combinations thereof, or multilayers thereof. The dielectric layer 51 may have a thickness between about 100 Å and about 2,500 Å, although different thicknesses may be used. The thickness of the dielectric layer 51 may be selected based on the desirable breakdown voltage of the respective power MOSFET 1. A higher breakdown voltage requires a greater thickness, and a lower breakdown voltage requires a smaller thickness.

The field plate 50 is placed on the top surface of the dielectric layer 51 and covers a part of the dielectric layer 51. The field plate 50 may include a conductive material such as polysilicon, a metal, a metal silicide, or the like.

A dielectric layer 52 is on the top surface of the field plate 50 and covers the field plate 50, so that the lateral surface of the dielectric layer 52 is substantially aligned with that of the field plate 50. The dielectric layer 52 may include silicon oxide, silicon nitride, silicon oxynitride, a high-k dielectric material, combinations thereof, or multi-layers thereof. In one embodiment, the material of the dielectric layer 52 is the same as that of the dielectric layer 51. In another embodiment, the material of the dielectric layer 52 is different from that of the dielectric layer 51.

The field plate 50, and the dielectric layer 52, and the gate electrode 40 define a Poly-Insulator-Poly (PIP) capacitor. The capacitance of the PIP capacitor can be determined by selecting the dimension and the material of the dielectric layer 52 based on the requirements of the design. Therefore, it is more flexible to design the capacitance of the power MOSFET 1.

A spacer 53 is on one side of the dielectric layer 51 and in contact with a coplanar surface defined by lateral surfaces of the field plate 50 and the dielectric layer 52. The lateral surface of the spacer 53 is substantially aligned with that of the dielectric layer 51. A spacer 54 is on another side of the dielectric layer 51 and in contact with a coplanar surface defined by lateral surfaces of the field plate 50 and the dielectric layer 52. The lateral surface of the spacer 54 is substantially aligned with that of the dielectric layer 51.

A spacer 55 is on the top surface of the substrate and may cover a part of the drain region 30 and a part of the first drift region 12a. The spacer 55 is in contact with a coplanar surface defined by lateral surfaces of the spacer 53 and the dielectric layer 51. The spacer 55 can prevent the undesired implanted ions of the drain region 30 from implanting/penetrating beneath the dielectric layer 51. The device performance variation increases (such as on resistance and the breakdown voltage) when n desired implanted ions of the drain region 30 diffuse to the drill region 12, affecting a defined profile of a heavily doped region such as the drain region 30. By using the spacer 55 to prevent the undesired implanted ions of the drain region 30 from implanting/penetrating beneath the dielectric layer 51 will improve the overlay control issue so as to reduce device performance variation.

A gate dielectric 43 is on the top surface of the substrate 10 and may cover a part of the second region 13 and a part of the second drift region 12b. The gate dielectric 43 is in contact with the lateral surface of the dielectric layer 51. In some embodiments, the gate dielectric 43 may include silicon oxide, silicon nitride, a high-k dielectric material, multi-layers thereof, or combinations thereof.

The gate electrode 40 includes two portions, a first portion of the gate electrode 40a and a second portion of the gate electrode 40b. The first portion of the gate electrode 40a is placed on the spacer 54 and the dielectric layer 52 and covers the spacer 54 and a part of the dielectric layer 52. The second portion of the gate electrode 40b is placed on the gate dielectric 43 and covers the gate dielectric 43. A first lateral surface 40b1 of the second portion of the gate electrode 40b is in contact with a coplanar surface defined by lateral surfaces of the dielectric layer 51 and the spacer 54. A second lateral surface 40b2, opposing to the first lateral surface 40b1, of the second portion of the gate electrode 40b is aligned with the lateral surface of the gate dielectric 43. The gate electrode 40 may include a conductive material such as doped polysilicon, a metal, a metal alloy, or the like.

A silicide layer 42 is on the top surface of the gate electrode 40 and fully covers the gate electrode 40. In other words, each side of the silicide layer 42 is substantially aligned with that of the gate electrode 40. The silicide layer 42 may be formed on the gate electrode 40 by a self-aligned silicide process.

Since the gate electrode 40 is fully covered by the silicide layer 42, the power MOSFET 1 has less gate resistance Rg in comparison with the conventional power MOSFET, in which the gate electrode is partially covered by the silicide layer. In one embodiment, the gate resistance Rg of the power MOSFET 1 is at least 3 times less than that of the conventional power MOSFET. The switching loss and the dead time of the power MOSFET can be improved by reducing the gate resistance Rg. This will improve the circuit's efficiency and performance.

A spacer 41 is on the top surface of the substrate 10 and may cover a part of the source region 20. The spacer 41 is in contact with a coplanar surface defined by lateral surfaces of the gate dielectric 43 and the second portion of the gate electrode 40b.

Figure 2:
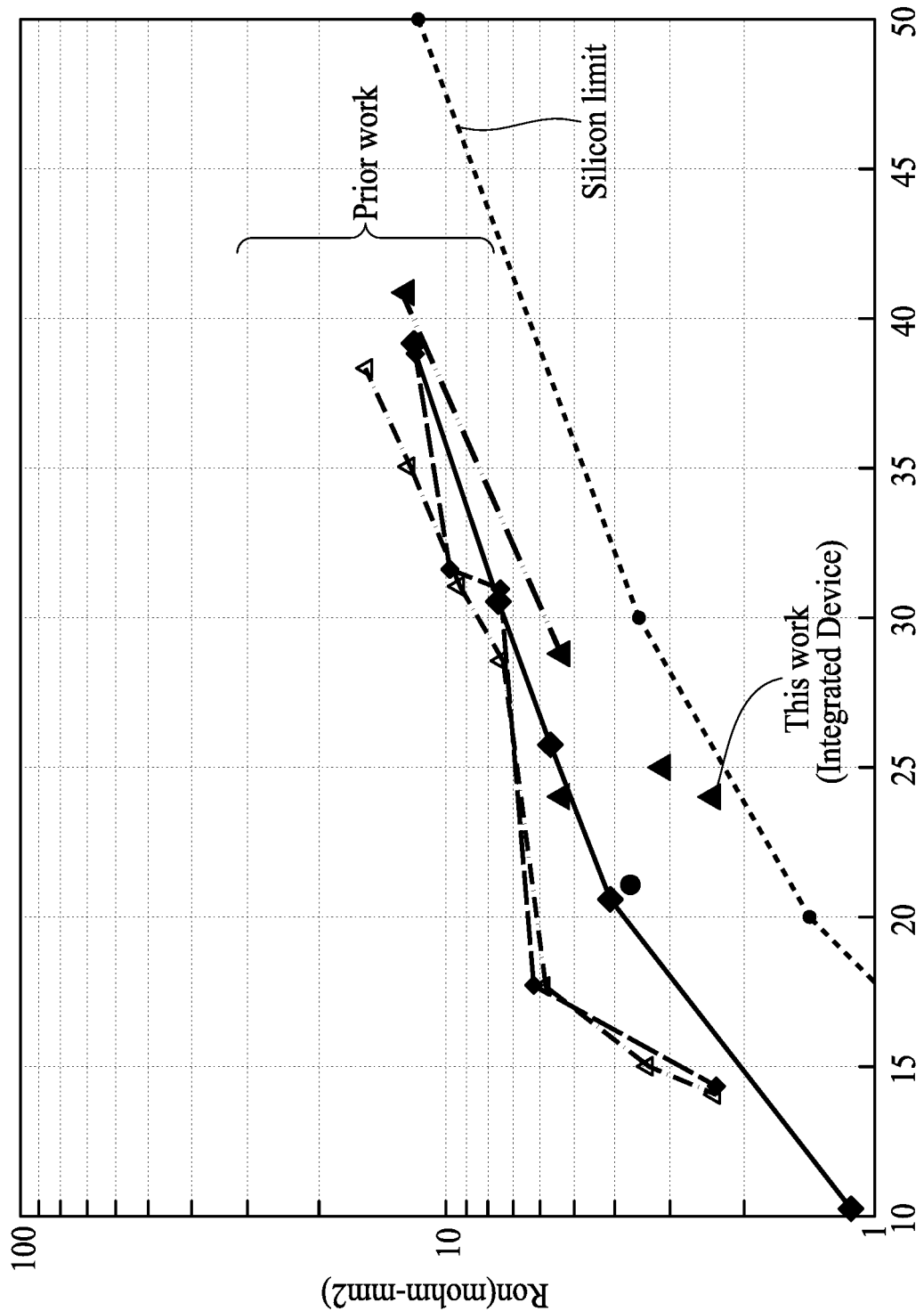
FIG. 2 is a diagram showing the performance of the power MOSFET in accordance with some embodiments.

FIG. 2 is a diagram showing the performance of a power MOSFET. The x-axis shows the breakdown voltage (BV), and the y-axis shows the on resistance (Ron). The dotted line shown in FIG. 2 represents a silicon limit of a power MOSFET. The breakdown voltage and the on resistance of a power MOSFET that is closer to the silicon limit performs better. As shown in FIG. 2, the breakdown voltage and the on resistance of the power MOSFET 1 of FIG. 1 is much closer to the silicon limit than that of all conventional power MOSFETs.

Therefore, the power MOSFET 1 shown in FIG. 1 has better performance in comparison with the conventional power MOSFETs.

FIGS. 3A-3F illustrate, in cross-sectional views, a method of manufacturing a power MOSFET, in accordance with some embodiments. The resulting power MOSFET may be the power MOSFET 1 shown in FIG. 1. Alternative methods may be used to make the power MOSFET 1 shown in FIG. 1 or alternative embodiments of the power MOSFET.

Figure 3A:
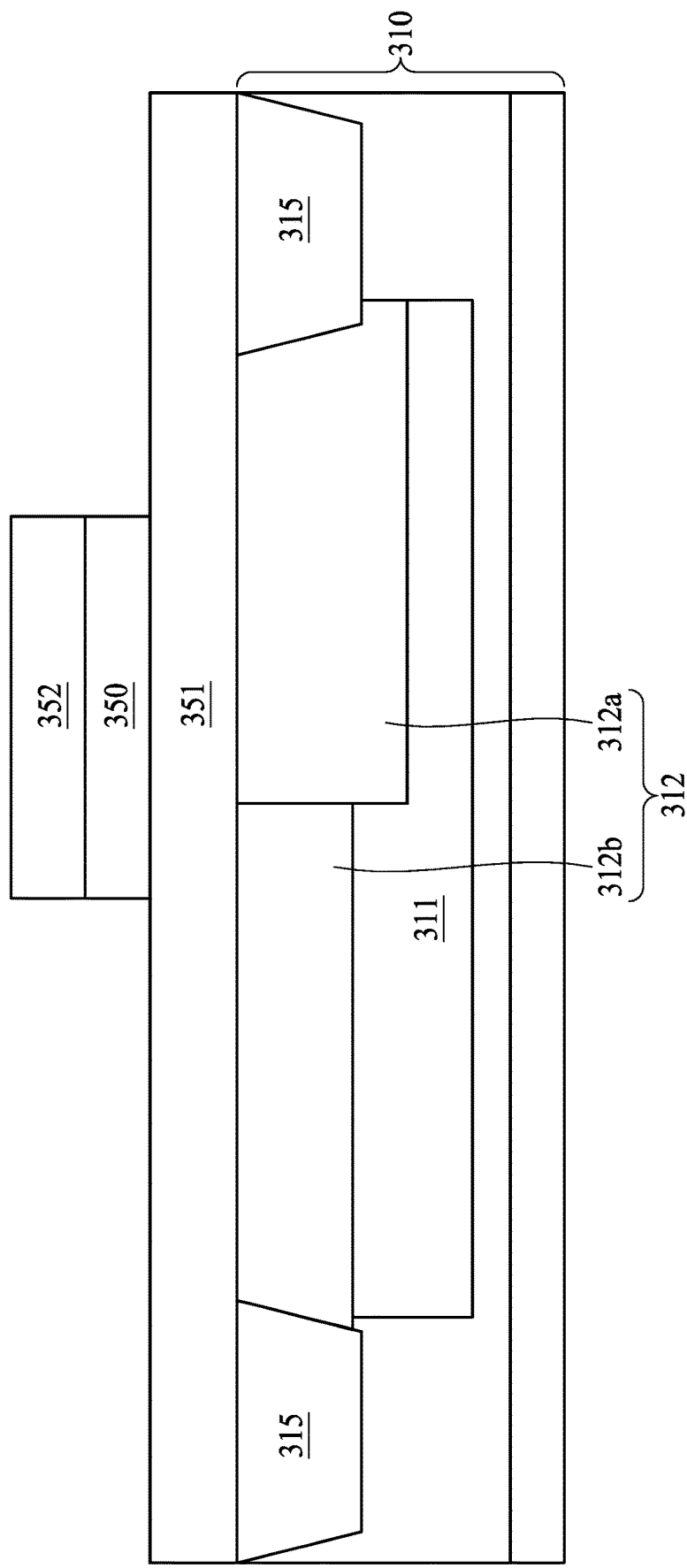
FIGS. 3A-3F illustrate a process of manufacturing a power MOSFET, in accordance with some embodiments.

As illustrated in FIG. 3A, a substrate 310 is provided. An optional n+ Buried Layer (NBL) may be formed in a portion of the substrate 310, (not shown in the drawing). A plurality of insulation regions 315, which may be shallow trench isolation (STI) regions, are formed to extend from the top surface of the substrate 310 into the substrate 310.

The first region 311 of a second conductivity type is formed by implanting ions of an impurity of a second conductivity type, such as a p type, into the substrate 310 through an insulating film and then thermally diffusing the implanted ions. The first region 11 may have an impurity concentration between about $10^{15}/cm^3$ and about $10^{17}/cm^3$, although a higher or a lower concentration may be used.

The drift region 312 of a first conductivity type, such as an n type, is formed within the first region 311. According to one embodiment, the drift region comprises a first drift region 312a and a second drift region 312b. The first drift region 312a extends from the top surface of the substrate 310 into the substrate 310. The n type impurity concentration of the first drift region 312a may be between about $10^{15}/cm^3$ and about $10^{17}/cm^3$, although higher or lower impurity concentrations may be adopted.

The second drift region 312b is formed within the first region 311, adjacent to the first drift region 312a, with a depth less than a depth of the first drift region 312a so that the first drift region 312a and the second drift region 312b together form a stepwise shape. The second drift region 312b may have a similar impurity concentration of the first conductivity type as the impurity concentration of the first drift region 312a. However, in some other embodiment, the second drift region 312b may have a different impurity concentration of the second conductivity type from the impurity concentration of the first drift region 312a. The first drift region 312a and the second drift region 312b may be firmed at the same time. In another embodiment, the first drift region 312a and the second drift region 312b may be formed at a different time.

A dielectric layer 351 is firmed on the top surface of the substrate 310 and covers the top surface of the substrate 310. The dielectric layer 351 may include silicon oxide, silicon nitride, silicon oxynitride, a high-k dielectric material, combinations thereof, or multi-layers thereof. The dielectric layer 351 may have a thickness between about 100 Å and about 2,500 Å, although different thicknesses may be used. The thickness of the dielectric layer 351 may be selected based on the desirable breakdown voltage of the respective power MOSFET. A higher breakdown voltage requires a greater thickness, and a lower breakdown voltage requires a smaller thickness.

The field plate 350 is formed on the top surface of the dielectric layer 351 and covers a part of the dielectric layer 351. The field plate 350 may comprise a conductive material such as polysilicon, a metal, a metal silicide, or the like.

A dielectric layer 352 is formed on the top surface of the field plate 350 and covers the field plate 350, so that the lateral surface of the dielectric layer 352 is substantially aligned with that of the field plate 350. The dielectric layer 352 may include silicon oxide, silicon nitride, silicon oxynitride, a high-k dielectric material, combinations thereof, or multi-layer stack thereof. In one embodiment, the material of the dielectric layer 352 is the same as that of the dielectric layer 351. In another embodiment, the material of the dielectric layer 352 is different from that of the dielectric layer 351.

Figure 3B:
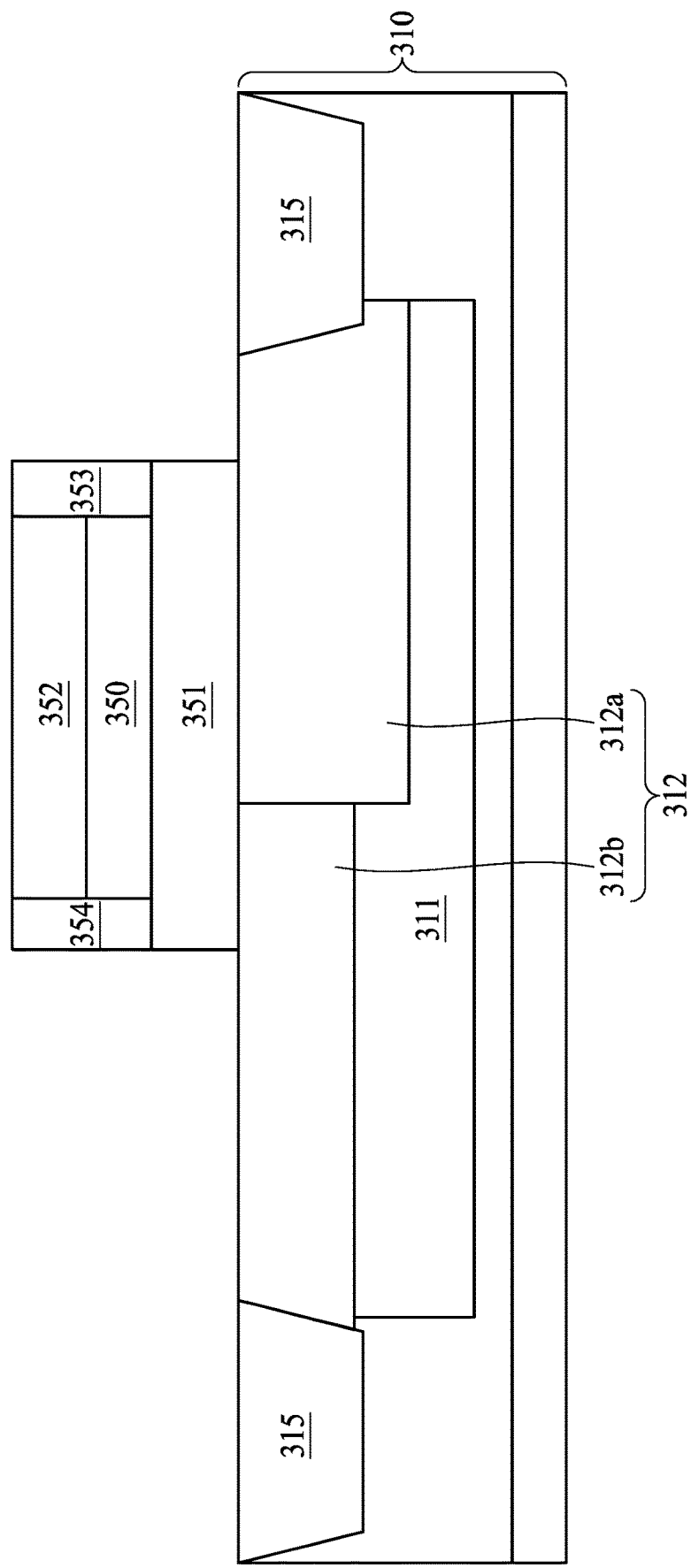

Referring to FIG. 3B, a spacer 353 is formed on one peripheral region of the dielectric layer 351 and in contact with a coplanar surface defined by lateral surfaces of the field plate 350 and the dielectric layer 352. A spacer 354 is formed on the other peripheral region of the dielectric layer 51 and in contact with a coplanar surface defined by lateral surfaces of the field plate 50 and the dielectric layer 52. In some embodiments, the peripheral regions of the dielectric layer 351 form a closed polygonal of a closed circular shape viewing from a top perspective (not shown in FIG. 3B).

A portion of the dielectric layer 351 that is not covered by the field plate 350 and the spacers 353, 354 is removed, so that the lateral surface of the dielectric layer 351 is substantially aligned with that of the spacers 353, 354.

Figure 3C:
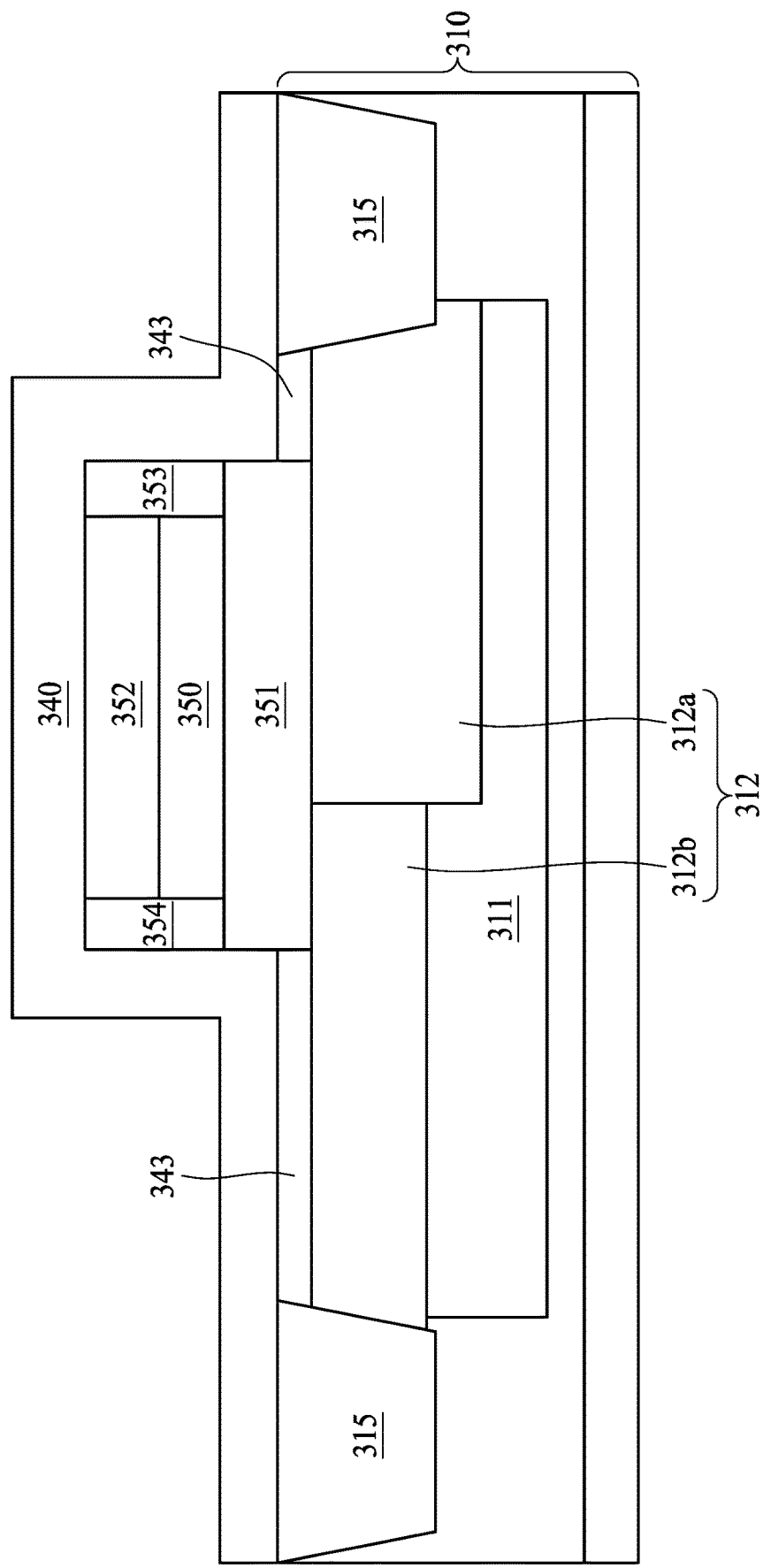

Referring to FIG. 3C, a gate dielectric 343 is formed on the top surface of the substrate 310 and may cover a part of the first drill region 312a and a part of the second drill region 312b. The gate dielectric 343 is in contact with the lateral surface of the dielectric layer 351. In some embodiments, the gate dielectric 343 may comprise silicon oxide, silicon nitride, a high-k dielectric material, multi-layers thereof, or combinations thereof.

The gate electrode 340 is formed to cover the substrate 310, the gate dielectric 343, the spacers 353, 354 and the dielectric layer 352. The gate electrode 340 may comprise a conductive material such as doped polysilicon, a metal, a metal alloy, or the like.

Figure 3D:
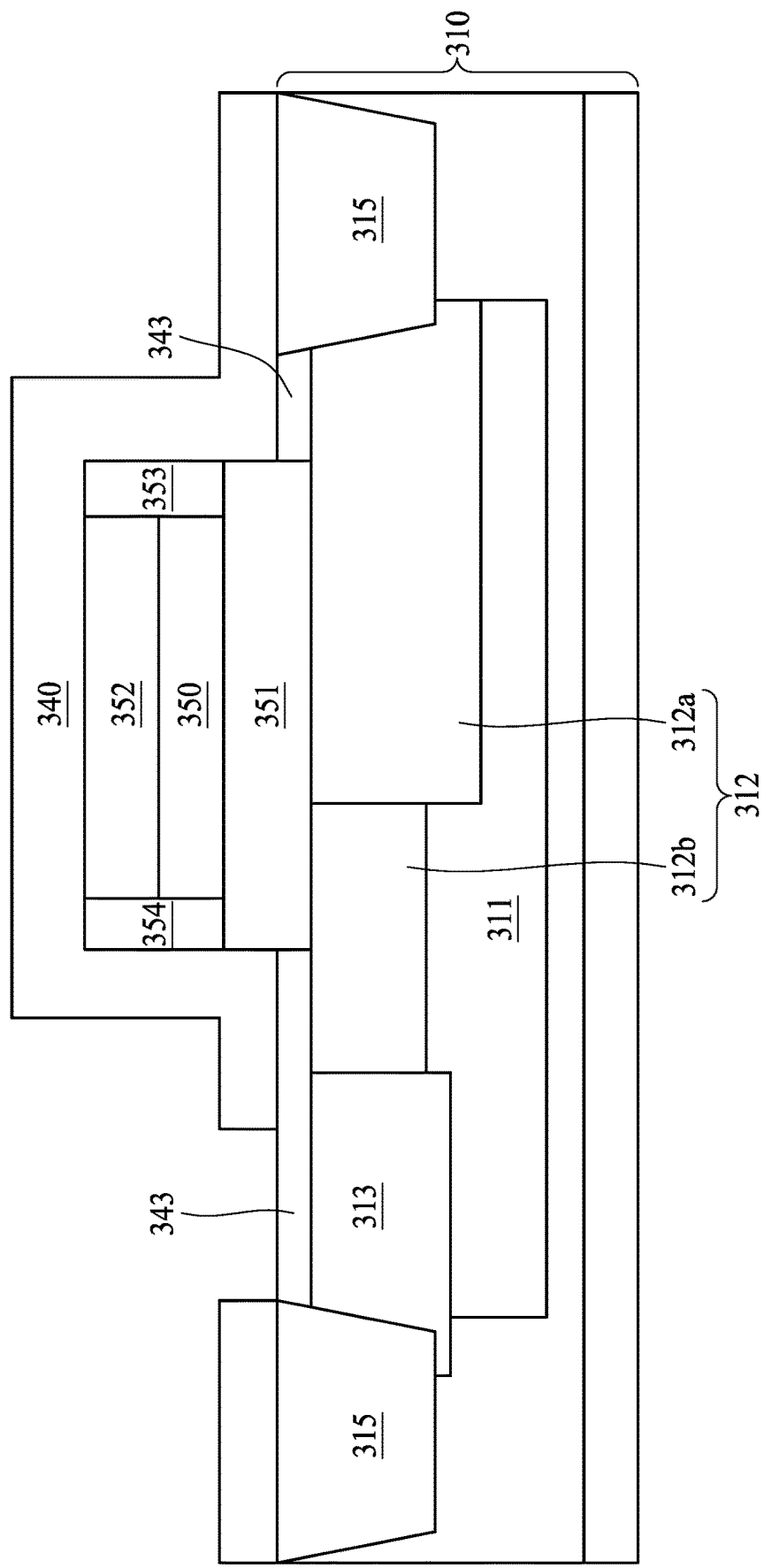

Referring to FIG. 3D, a first part of the gate electrode 340 is removed to expose a portion of the second portion of the drift region 312b. An implantation is then performed to dope the exposed portion of the second portion of the drift region 312b to form a second region 313. The second region 313 is formed within the first region 311, next to the insulation region 315. In some exemplary embodiments, the second region 313 has a p type impurity concentration higher than the impurity concentration of first region 311. The second region 313 may be formed by other methods as well.

Figure 3E:
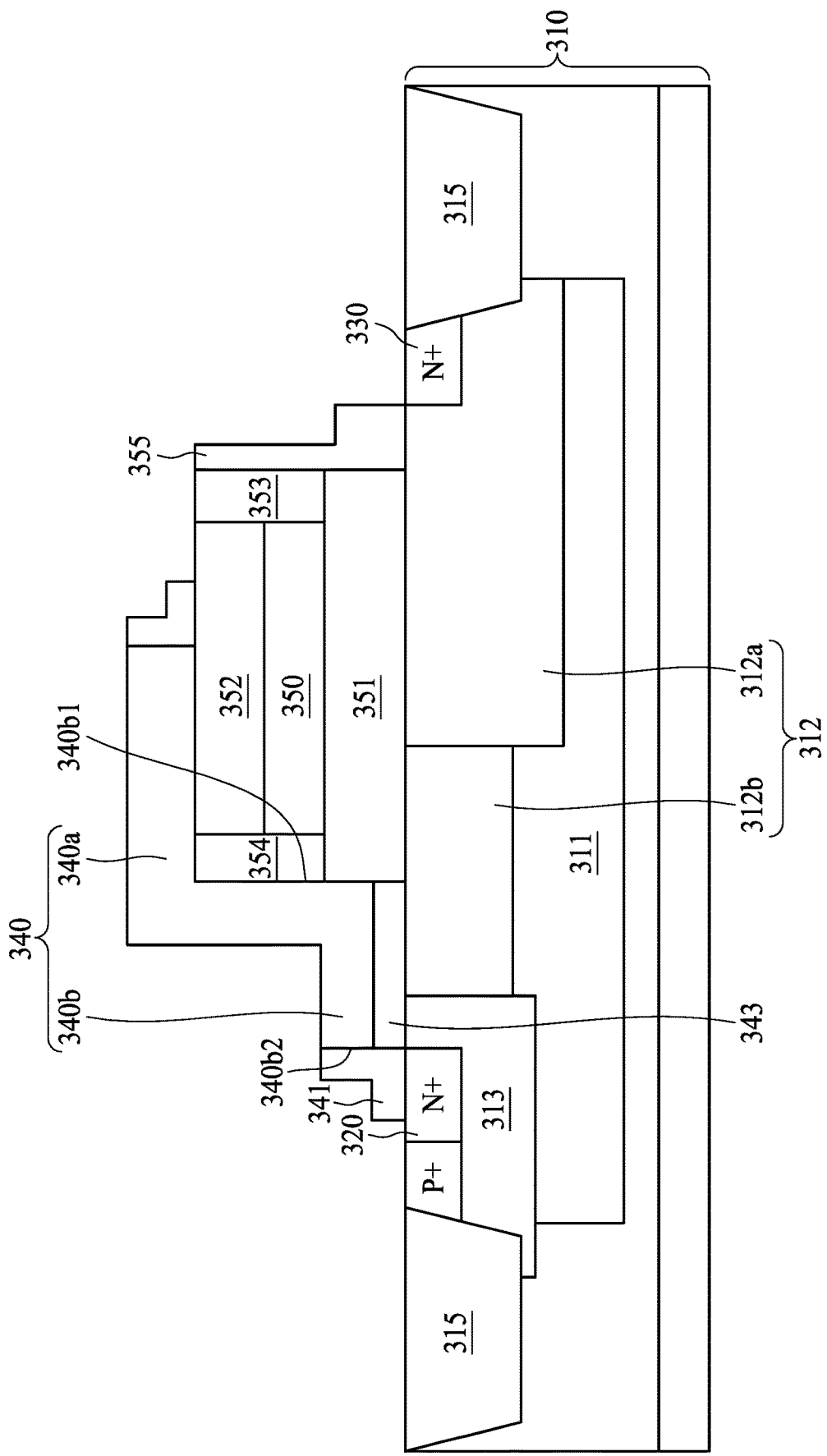

Referring to FIG. 3E, a second part of the gate electrode 340 is removed. The remaining part of the gate electrode 340 includes two portions, a first portion of the gate electrode 340a and a second portion of the gate electrode 340b. The first portion of the gate electrode 340a is on the spacer 354 and the dielectric layer 352 and covers the spacer 354 and a part of the dielectric layer 352. The second portion of the gate electrode 340b is on the gate dielectric 343 and covers the gate dielectric 343. A first lateral surface 340b 1 of the second portion of the gate electrode 340b is in contact with a coplanar surface defined by lateral surfaces of the dielectric layer 351 and the spacer 354. A second lateral surface 340b 2, opposing to the first lateral surface 340b 1, of the second portion of the gate electrode 340b is aligned with the lateral surface of the gate dielectric 343.

A spacer 341 is formed on the top surface of the substrate 310 and may cover a part of the second region 313. The spacer 341 is in contact with a coplanar surface defined by lateral surfaces of the gate dielectric 343 and the second portion of the gate electrode 340b.

A spacer 355 is formed on the top surface of the substrate 310 and may cover a part of the first drift region 312a. The spacer 355 is in contact with a coplanar surface defined by lateral surfaces of the spacer 353 and the dielectric layer 351.

The source region 320 of the first conductivity type is formed within the second region 313 by implanting ions of an impurity of a first conductivity type, such as an n type, into the second region 313. The drain region 330 of the first conductivity type is formed within the first drift region 312a by implanting ions of an impurity of a first conductivity type, such as an n type, into the first drift region 312a. The source region 320 may have a source contact (not shown in the drawing). The drain region 330 may have a drain contact (not shown in the drawing). The source region 320 and the drain region 330 may be formed by implanting an n type, such as phosphorous to a concentration between about $1\times10^{19}/cm^3$ and about $2\times10^{21}/cm^3$, for example. Alternatively, other n type dopants such as arsenic, antimony, or combinations thereof, may also be used.

When implanting ions of an impurity of a first conductivity type into the second region 313 to form the drain region 330, the spacer 355 serves as a hard mask to self-align the implant of the drain region 330 and prevents the undesired implanted ions of the drain region 330 from implanting/penetrating, beneath the dielectric layer 351. The dopant diffusion wider the field plate can be more severe during a post annealing operation after the implant. This will improve the overlay control issue and reduce device performance variation.

Figure 3F:
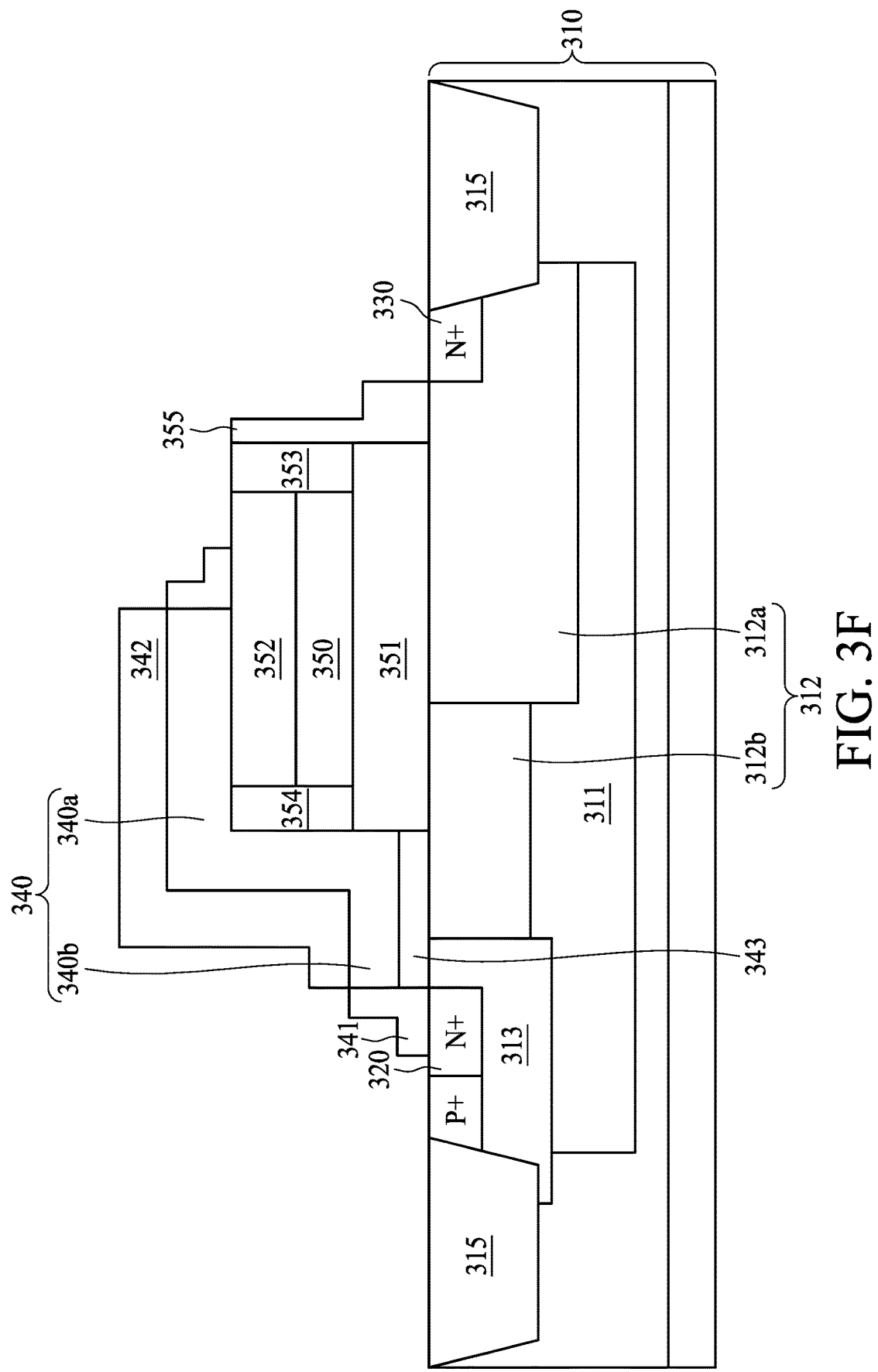

Referring to FIG. 3F, a silicide layer 342 is formed on the top surface of the gate electrode 340 and fully covers the gate electrode 340 to form the power MOSFET 1, as shown in FIG. 1. Each side of the silicide layer 342 is substantially aligned with that of the gate electrode 340. The silicide layer 342 may be formed on the gate electrode 340 through a self-aligned silicide process.

Since the formation of the gate electrode 340 occurs after the formation of the field plate 350, the gate electrode 340 can be fully covered by the silicide layer 342. By doing so, the power MOSFET 1 has less gate resistance Rg in comparison with the conventional power MOSFET, in which the gate electrode is partially covered by the silicide layer. In one embodiment, the gate resistance Rg of the power MOSFET 1 is at least 3 times less than that of the conventional power MOSFET. The switching loss and the dead time of the power MOSTET can be improved by reducing the gate resistance Rg. This will improve circuit efficiency and performance.

The process shown in FIGS. 3A-3F is merely illustrative and is not limiting. There may be other variations of the process steps, and the process steps may be performed in different sequences. Other process steps may follow after the process shown in FIGS. 3A-3F. For example, a contact plug may be formed to access the field plate. The source region may have a source contact. The drain region may have a drain contact.

In accordance with embodiments of the present disclosure, the gate resistance Rg can be reduced by fully covering the gate electrode of the power MOSFET by the silicide layer, so as to improve the issues of the switching loss and dead time of the power MOSFET. In addition, by using the spacer to self-align the implant of the drain region can prevent the undesired implanted ions of the drain region from implanting/penetrating beneath the dielectric layer, so as to improve the overlay control issue and to reduce device performance variation.

In accordance with an embodiment, a semiconductor device comprises a substrate, a source region, a drain region, a field plate and a gate electrode. The source region is of a first conductivity type and located at a first side within the substrate. The drain region is of the first conductive type located at a second side within the substrate opposite to the first side. The field plate is over the substrate and between the source region and the drain region. The gate electrode has a first portion and a second portion, wherein the first portion of the gate electrode is located over the field plate.

In accordance with another embodiment, a semiconductor device, comprising: a substrate, a drift region, a second region, a source region, a drain region, a field plate and a gate electrode. The drift region is with a first conductivity type, extending from a top surface of the substrate into the substrate and located in proximity to a first side of the substrate. The second region is with a second conductivity type, extending from the top surface of the substrate into the substrate and located in proximity to a second side of the substrate opposite to the first side. The source region is of a first conductivity type within the second region. The drain region is of the first conductive type within the drift region. The field plate is over the drift region. The gate electrode is over the first region and the drill region, wherein a top surface of the gate electrode is substantially fully covered by a silicide layer.

In accordance with another embodiment, a method of manufacturing a semiconductor device comprises providing a substrate; forming a source region of a first conductivity type at a first side within the substrate; forming a drain region of the first conductive type located at a second side within the substrate opposite to the first side; forming a field plate over the substrate and between the source region and the drain region; and forming a gate electrode over the substrate after forming the field plate.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:

1. A semiconductor device, comprising:
a substrate having a top surface, comprising:
a first drift region with a first conductivity type, extending from the top surface of the substrate into the substrate; and
a second drift region with the first conductivity type, extending from the top surface of the substrate into the substrate and adjacent to the first drift region;
a field plate over the substrate;
a gate electrode having a first portion and a second portion, wherein the first portion of the gate electrode is located over the field plate; and
a first dielectric layer sandwiched by the substrate and the field plate;
wherein the first portion of the gate electrode is overlapping with a boundary of the first drift region and the second drift region in the substrate.

2. The semiconductor device of claim 1, further comprising a silicide layer on the gate electrode, and each side of the silicide layer is substantially aligned with each side of the gate electrode.

3. The semiconductor device of claim 1, further comprising a second dielectric layer between the field plate and the first portion of the gate electrode.

4. The semiconductor device of claim 1, further comprising a first spacer in contact with a side of the first dielectric layer.

5. The semiconductor device of claim 4, wherein a side of the first spacer is align with a boundary of the drain region and the first drill region.

6. The semiconductor device of claim 4, wherein the field plate is laterally sandwiched by a second spacer and a third spacer, and the second spacer is between the field plate and the first spacer.

7. The semiconductor device of claim 6, wherein a top surface of the first spacer is coplanar to a top surface of the second spacer.

8. The semiconductor device of claim 1, further comprising a fourth spacer over the field plate, and a top surface of the fourth spacer is coplanar to a top surface of the first portion of the gate electrode.

9. A semiconductor device, comprising:
a substrate having a top surface, comprising:
a first drift region with a first conductivity type, extending from the top surface of the substrate into the substrate;
a second drift region with the first conductivity type, extending from the top surface of the substrate into the substrate and located adjacent to the first drift region; and
a drain region of the first conductive type within the first drift region;
a field plate over the substrate;
a gate electrode having a first portion and a second portion, wherein the first portion of the gate electrode is located over the field plate; and
a silicide layer on the gate electrode, and an upper surface of the gate electrode is entirely in contact with the silicide layer.

10. The semiconductor device of claim 9, wherein both the field plate and the first portion of the gate electrode overlap a boundary of the first drift region and the second drift region in the substrate.

11. The semiconductor device of claim 9, further comprising:
a first dielectric layer sandwiched by the substrate and the field plate; and
a second dielectric layer sandwiched by the field plate and the first portion of the gate electrode.

12. The semiconductor device of claim 11, further comprising a first spacer in contact with the top surface of the substrate and a side of the first dielectric layer.

13. The semiconductor device of claim 12, further comprising a second spacer and a third spacer in contact with two opposite sides of the field plate, respectively.

14. The semiconductor device of claim 13, further comprising a fourth spacer over the field plate, and a top surface of the fourth spacer is coplanar to a top surface of the first portion of the gate electrode.

15. The semiconductor device of claim 14, wherein the fourth spacer is isolated from the first spacer, the second spacer, and the third spacer.

16. A semiconductor device, comprising:
a substrate having a top surface, comprising:
a first drift region with a first conductivity type, extending from the top surface of the substrate into the substrate;
a second drift region with the first conductivity type, extending from the top surface of the substrate into the substrate and adjacent to the first drift region; and
a drain region of the first conductive type within the first drift region;
a field plate over the substrate; and
a gate electrode having a first portion and a second portion, wherein the first portion of the gate electrode is located over the field plate;
a first dielectric layer in contact with the top surface of the substrate and under the field plate; and
a first spacer in contact with the top surface of the substrate and a side of the first dielectric layer;
wherein a side of the first spacer is aligned with a boundary of the drain region and the first drift region.

17. The semiconductor device of claim 16, wherein both the field plate and the first portion of the gate electrode overlap a boundary of the first drift region and the second drift region in the substrate.

18. The semiconductor device of claim 16, further comprising a silicide layer on the gate electrode, and an upper surface of the gate electrode is entirely in contact with the silicide layer.

19. The semiconductor device of claim 18, further comprising:
a first region with a second conductivity type in the substrate; and
a second region with the second conductivity type, extending from the top surface of the substrate into the substrate and over the first region.

20. The semiconductor device of claim 19, wherein the second portion of the gate electrode overlaps a boundary of the second region and the second drift region in the substrate.

* * * * *